United States Patent [19]

Suski

[11] Patent Number: 5,419,780

[45] Date of Patent: May 30, 1995

[54] METHOD AND APPARATUS FOR RECOVERING POWER FROM SEMICONDUCTOR CIRCUIT USING THERMOELECTRIC DEVICE

[75] Inventor: Edward D. Suski, Lake Forest, Calif.

[73] Assignee: AST Research, Inc., Irvine, Calif.

[21] Appl. No.: 235,679

[22] Filed: Apr. 29, 1994

[51] Int. Cl.$^6$ .............................................. H01L 35/32
[52] U.S. Cl. ..................... 136/205; 136/201; 136/224; 136/242
[58] Field of Search ............... 136/201, 203, 204, 205, 136/207, 211, 212, 224, 225, 242; 62/3.2, 3.3, 3.7

[56] References Cited

U.S. PATENT DOCUMENTS

| | | | |
|---|---|---|---|
| 2,362,259 | 11/1944 | Findley | 171/125 |
| 2,363,168 | 11/1944 | Findley | 126/110 |
| 2,390,578 | 12/1945 | Findley | 136/4 |
| 2,519,241 | 8/1950 | Findley | 126/116 |
| 2,984,077 | 5/1961 | Gaskill | 62/3 |
| 2,994,203 | 8/1961 | Lackey et al. | 62/3 |
| 3,437,576 | 4/1969 | Nelson et al. | 204/192 |
| 4,253,515 | 3/1981 | Swiatosz | 165/61 |
| 4,402,185 | 9/1983 | Perchak | 62/3 |
| 4,467,611 | 8/1984 | Nelson et al. | 62/3 |
| 4,665,707 | 5/1987 | Hamilton | 62/3 |
| 4,704,872 | 11/1987 | Jones | 62/3 |
| 4,833,889 | 5/1989 | Harwell et al. | 62/3.2 |
| 4,848,090 | 7/1989 | Peters | 62/3.3 |
| 4,947,648 | 8/1990 | Harwell et al. | 62/3.2 |
| 4,971,632 | 11/1990 | Rowe | 136/2.2 |
| 4,983,225 | 1/1991 | Rowe | 136/201 |
| 5,012,325 | 4/1991 | Mansuria | 357/81 |
| 5,040,381 | 8/1991 | Hazen | 62/3.2 |
| 5,057,490 | 10/1991 | Skertic | 505/1 |
| 5,156,688 | 10/1992 | Buhler et al. | 136/211 |

FOREIGN PATENT DOCUMENTS 2097184 10/1982 United Kingdom .................... 62/3.3

Primary Examiner—Donald P. Walsh
Assistant Examiner—Chrisman D. Carroll
Attorney, Agent, or Firm—Knobbe, Martens, Olson & Bear

[57] ABSTRACT

An apparatus and method for recovering power dissipated by a semiconductor integrated circuit includes a thermoelectric generator which converts the heat generated by the integrated circuit into electrical energy. The electrical energy is used to drive a fan or other airflow generating device to cause heated air to be moved away from the integrated circuit and cooler air to be drawn to the integrated circuit to absorb further heat from the integrated circuit. In the described embodiment, the thermoelectric generator is a Peltier cooler positioned between the integrated circuit and a heatsink. The Peltier cooler is operated in the Seebeck mode to generate power in response to the temperature differential between the integrated circuit and the heatsink. The fan is positioned proximate to the heatsink to cause air flow over the heatsink thereby reducing the temperature of the heatsink and thus reducing the temperature of the integrated circuit by causing more heat to be transferred from the integrated circuit to the heatsink.

15 Claims, 4 Drawing Sheets

METHOD AND APPARATUS FOR RECOVERING POWER FROM SEMICONDUCTOR CIRCUIT USING THERMOELECTRIC DEVICE

BACKGROUND OF THE INVENTION

1. Field of the Invention

The present invention is in the field of personal computers and the like, and, more particularly, is in the field of recovering wasted heat energy generated by personal computers and performing a useful task with the energy, such as to provide needed cooling without consuming limited battery resources.

2. Description of the Related Art

Personal computers are computer systems based upon microprocessors installed in an enclosure with various support components. Such a computer system may be a so-called desktop model which is combined with a keyboard and monitor to provide a complete standalone system. Alternatively, the computer system may be a portable laptop or notebook system in which the keyboard and monitor are permanently attached to the base unit and which includes a battery for providing power to the components in the system when the system is not plugged in. As microprocessors become faster and more powerful in their processing capabilities, the amount of power dissipated by the microprocessors and support components increases significantly. This dissipated power appears as heat in the computer system, and, if the heat is not removed from the system, the heat can increase to a level that can harm the components in the computer system.

In desktop computer systems which are connected to a conventional AC power source, the dissipation of the heat generated by the semiconductor components is accomplished by providing an exhaust fan in an outlet from the computer system enclosure. In some computer systems, a heat sink on the microprocessor is combined with a small fan mounted on the heat sink to provide additional air flow for the microprocessor. Although this works fine for desktop computer systems which are connected to AC power, in battery powered laptop or notebook computer systems, the only power available for portable operation is the battery. The additional power required to operate an exhaust fan or a fan mounted on a heat sink would reduce the amount of time that the computer system can operate from the battery. Thus, exhaust fans or heat sink fans have generally not been used on portable computer systems. However, as microprocessors become increasingly powerful, the heat generated by the microprocessors has become quite high. For example, the Intel Pentium processor may dissipate as much as 8-12 watts of power, much of which is generated as heat. Thus, a need exists for an apparatus for removing the heat generated by the microprocessor without increasing the power required from the battery of the portable computer.

SUMMARY OF THE INVENTION

One aspect of the present invention is an apparatus that removes heat from a semiconductor device. The apparatus comprises a thermoelectric generator that converts heat energy to electrical energy. The thermoelectric generator is positioned on the semiconductor device to receive heat generated by the semiconductor device. The thermoelectric generator produces an output voltage in response to the heat. An airflow generating device is electrically connected to receive the output voltage from the thermoelectric generator. The airflow generating device is responsive to the output voltage to cause air to flow. The airflow generating device is positioned proximate to the semiconductor device so that air caused to flow by the airflow generating device removes heat from the semiconductor device to thereby reduce the temperature of the semiconductor device. In preferred embodiments of the present invention, the airflow generating device is a fan. Preferably, the present invention includes a heatsink that increases the rate at which heat is conducted away from the semiconductor device. In such embodiments, the thermoelectric generator is positioned between the heatsink and the semiconductor device, and the airflow generating device is positioned to cause air to flow over the heatsink. In particularly preferred embodiments of the present invention, the thermoelectric generator is constructed from materials generally used in the construction of commercially available thermoelectric cooling devices operated in the Peltier mode. These relatively low temperature modules, having maximum temperatures of around 80 degrees Centigrade, are particularly attractive for application in personal computers.

Another aspect of the present invention is a method for cooling a semiconductor device. The method comprises the steps of positioning a thermoelectric generator proximate to the semiconductor device, and generating electrical power by the thermoelectric generator in response to heat generated by the semiconductor device. The method further includes the steps of connecting the electrical power generated by the thermoelectric generator to an airflow generating device, and generating an airflow to remove heat from the semiconductor device in response to the electrical power generated by the thermoelectric generator. Preferably, the airflow generating device comprises a fan, and the thermoelectric generator comprises a Peltier cooler operating in the Seebeck mode to generate electrical power responsive to a temperature differential across the device. In particularly preferred embodiments, the method includes the further step of positioning the thermoelectric generator between the semiconductor device and a heatsink.

Another aspect of the present invention is a method for utilizing the heat energy generated by a semiconductor circuit in an electronic system. The method comprises the steps of positioning a thermoelectric generator proximate to the semiconductor circuit so that the heat generated by the semiconductor circuit is transferred to the thermoelectric generator, and generating electrical energy by the thermoelectric generator responsive to the heat transferred from the semiconductor circuit. The method includes the further steps of transferring the electrical energy to an electrically operated device, and operating the electrically operated device in response to the electrical energy.

DETAILED DESCRIPTION OF THE PREFERRED EMBODIMENTS

Figure 1:
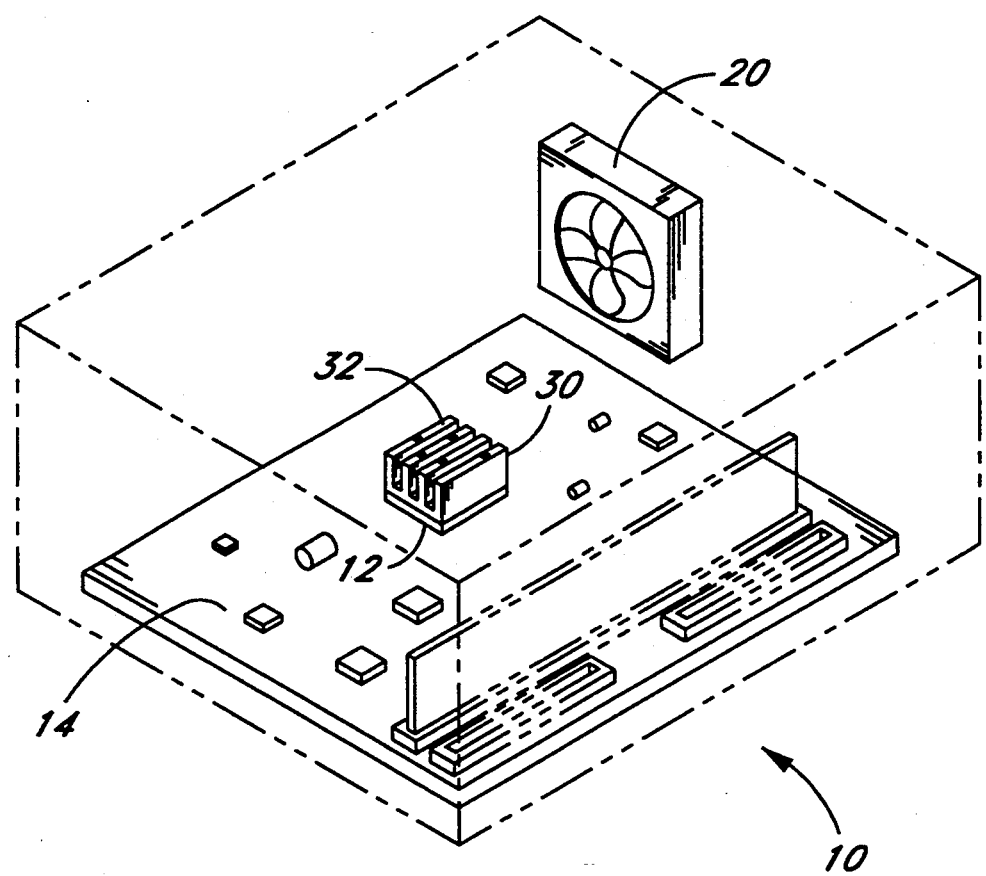
FIG. 1 illustrates a perspective view of a conventional integrated circuit on a motherboard in a computer system having a conventional exhaust fan and a conventional heatsink to move heat away from the integrated circuit.

FIG. 1 illustrates selected components of a prior art computer system 10 to assist in explaining the problem solved by the present invention. As illustrated in FIG. 1, the computer system 10 comprises an integrated circuit 12 which is installed on a motherboard 14. Other components, such as a power supply, disk drives, monitor, keyboard, and the like, are not shown. The computer system 10 may be, for example, any of a number of different computer systems based upon a microprocessor such as the Intel 80486, the Intel Pentium, or other high performance microprocessors. The present invention, described below, may be used in connection with any such microprocessor, or in connection with other integrated circuits which have high power input requirements and thus generate substantial quantities of heat as part of their normal operation.

It is well known that sustained high temperature is detrimental to the operation of integrated circuits and other electronic devices, and thus a number of methods have been developed to remove heat from the vicinity of such electronic devices. For example, the computer system 10 includes an exhaust fan 20 which draws air into the computer system 10 through vents (not shown). The air flows across the motherboard 14 and other circuit boards (not shown) and thus replaces air heated by the integrated circuits (e.g., the integrated circuit 12) with lower temperature air from outside the computer system 10. Thus, the temperature of the integrated circuit 12 and other integrated circuits is prevented from increasing to a temperature that might harm the integrated circuits.

It has been found that the exhaust fan 20 alone may not cause enough air flow to maintain the temperature of higher power integrated circuits at a sufficiently low temperature. Furthermore, in laptop and notebook computer systems, there is no room or power source for such an exhaust fan. Thus, heatsinks are often provided for higher powered integrated circuits. The use of heatsinks is well known in the art. Basically, a heatsink, such as a heatsink 30 in FIG. 1, comprises a heat conductive metal or other suitable material. The heatsink 30 is typically mounted in thermal contact with the integrated circuit 12 so that heat generated by the integrated circuit 12 is readily conducted to the heatsink 30. The heatsink 30 is mounted to the integrated circuit 12 by a mechanical device such as a clamp (not shown) or by a thermally conductive adhesive (not shown). The mounting of heatsinks on integrated circuits is well known to the art and will not be discussed in detail. The heatsink 30 may be configured with fins 32 or the like to increase the surface area of the heatsink 30 in contact with the air which is caused to flow by the exhaust fan 20. Thus, the heatsink 30 serves the dual purpose of drawing heat away from the integrated circuit 14 and transferring the heat to the air flowing past the heatsink 30. In laptop and notebook computer systems, the heatsink 30 may be positioned to conduct the heat to a metal shield or the like to increase the flow of heat from the integrated circuit 12.

As the power of the integrated circuits has increased further, it has been found that the heatsink 30 alone is not sufficient to conduct enough heat away from the integrated circuit 12. One problem is that a typical exhaust fan 20 used in a computer system 10 does not provide a sufficient quantity of air flow in the vicinity of the integrated circuits, such as the integrated circuit 12. Thus, as illustrated FIG. 2, an improved heatsink 40 has been developed to increase the transfer of heat away from the integrated circuit 12. The improved heatsink 40 includes a small fan 42 which is mounted directly on the heatsink 40 by suitable mounting devices. Alternatively, the frame of the small fan 42 may be configured as the heatsink 40 so that the small fan 42 and the heatsink 40 comprise a single device. The small fan 42 is connected to a source (not shown) of AC or DC power by a pair of wires 44. The small fan 42 draws air through the fins of the heatsink 40. The air moved by the small fan 42 mixes with the air moved by the exhaust fan 20 and is thus exhausted from the computer system 10.

Figure 2:
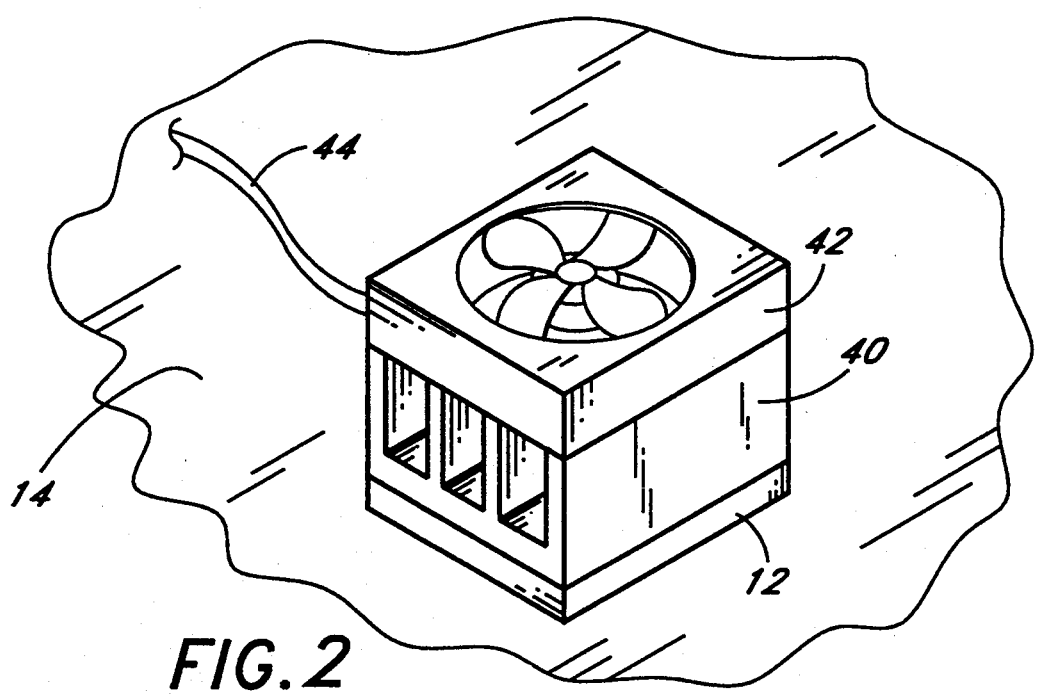
FIG. 2 illustrates a perspective view of a conventional integrated circuit in which a small fan is added to the heatsink to enhance the flow of heat from the heatsink.

The prior art embodiment of FIG. 2 is an improvement over the embodiment of FIG. 1; however, it has a number of drawbacks which make the embodiment impractical for laptop or notebook computer systems which operate from batteries. In particular, the power required by the small fan 42 of FIG. 2 must be provided by the battery, thus increasing the power consumption of a laptop or notebook computer system. The increased power consumption reduces the amount of time that the computer system 10 can operate from a battery, thus requiring a larger battery or requiring the battery to be charged more often. Furthermore, even when the computer system 10 is being operated from conventional AC power, the small fan 42 increases the power consumption of the computer system 10. At the present time, it is highly desirable to reduce the power consumption of all computer systems including AC-powered computer systems as well as battery powered computer systems. This problem has become particularly important as more computer users are demanding the highest powered microprocessors in the portable laptop and notebook computer systems.

Figure 3:
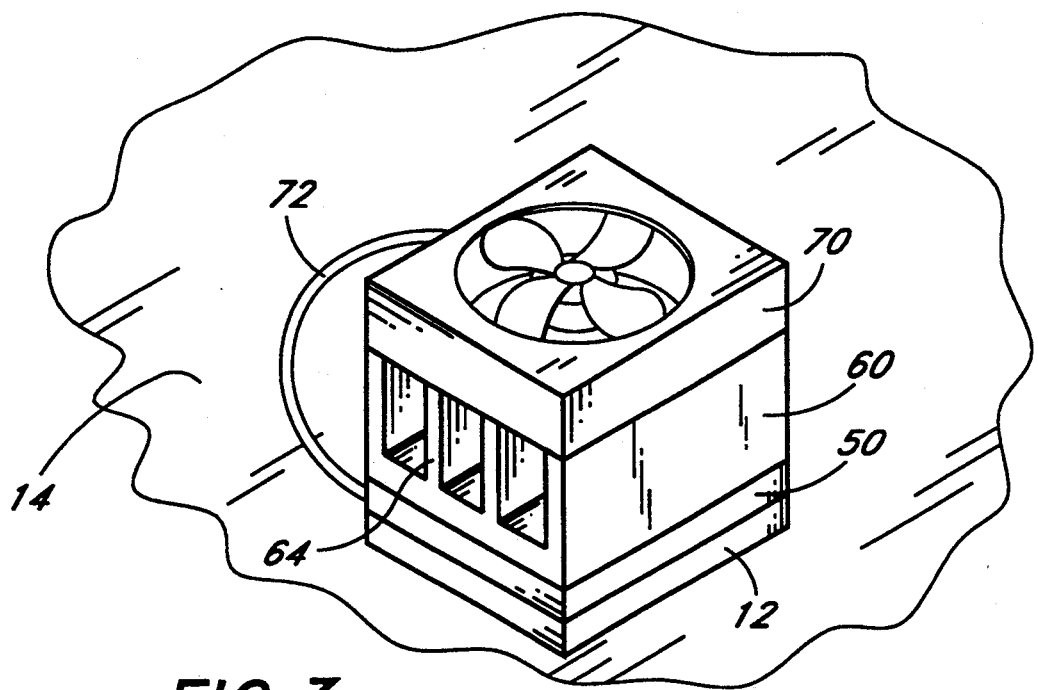
FIG. 3 illustrates a perspective view of a preferred embodiment of the present invention in which a thermoelectric generator is interposed between the integrated circuit and the heatsink to generate electrical power for the fan attached to the heatsink.
Figure 4:
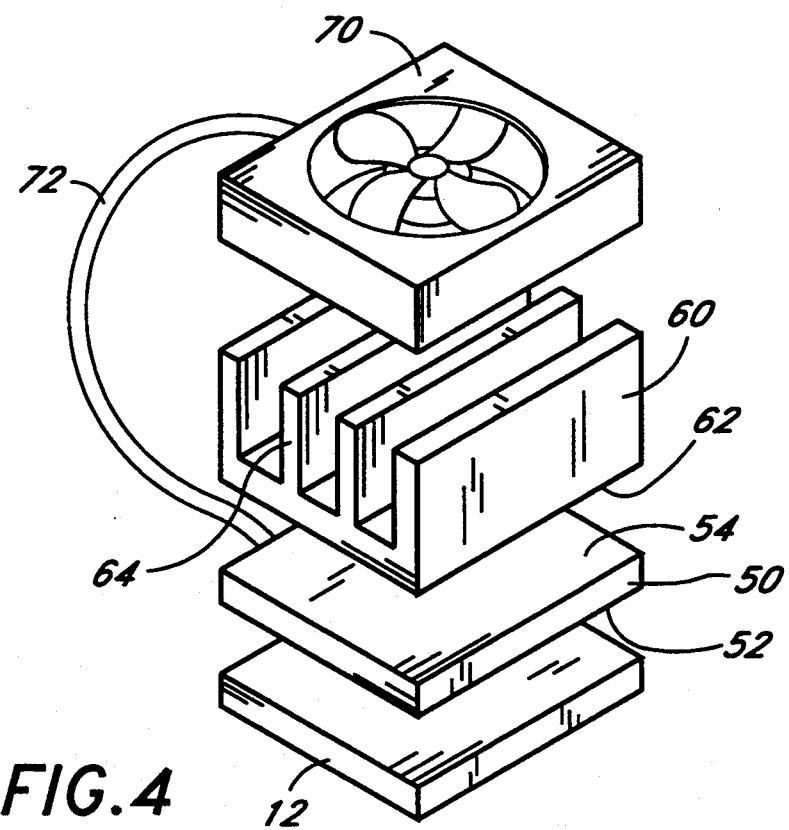
FIG. 4 illustrates an exploded view of the preferred embodiment of FIG. 3.

The present invention is illustrated in FIGS. 3 and 4 and provides an apparatus and method for reducing the temperature of the integrated circuit 12 without increasing the power consumption of the computer system 10. It is particularly useful in battery-powered computer systems such as in laptop and notebook computer systems. The present invention includes a thermoelectric generator 50 such as a well-known Peltier cooler operating in the Seebeck mode. A Peltier cooler is best known as a thermoelectric cooler which generates a temperature differential between two opposing surfaces 52 and 54 when a voltage is applied across the device 50. However, it has been found that a Peltier cooler can be operated in the Seebeck mode as an electrical generator. That is, when a temperature differential is applied across the two opposing surfaces of the thermoelectric generator 50, the thermoelectric generator 50 generates a DC voltage responsive to the temperature differential.

This effect is described more fully by Gao Min and D. M. Rowe in "Optimisation of thermoelectric module geometry for 'waste heat' electric power generation," *Journal of Power Sources,* Vol. 38, pp. 253–259 (1992), which is incorporated herein by reference. As discussed therein, a commercially available Peltier module, the CP 1.4-127-045L module from MELCOR, U.S.A., generates approximately 550 milliwatts of power at a temperature difference of approximately 50 degrees Centigrade. This temperature difference can occur between the integrated circuit 12 operating at a maximum allowable case temperature of 80 degrees Centigrade and an ambient temperature of 30 degrees Centigrade, for example. As discussed in the Gao Min and D. M. Rowe article, the power output of the thermoelectric generator 50 can be increased by reducing the length of the thermoelectric elements (see FIG. 6). Although this reduced length decreases the thermoelectric conversion efficiency of the thermoelectric generator 50, the reduced efficiency is not a significant factor, and the reduced length has the further advantage of improving the flow of heat from the integrated circuit 12. The reduced length has the still further advantage of reducing the profile of the thermoelectric generator 50 which is advantageous in the limited space available in a notebook or sub-notebook computer system.

In the embodiments of FIGS. 3 and 4, the thermoelectric generator 50 is positioned with its high temperature surface (e.g., the surface 52) in thermal contact with the top surface of the integrated circuit 12. Preferably, the thermal contact is enhanced by the use of a thermally conductive adhesive such as, for example, Wakefield Engineering type 120 or Dow type 340 adhesive (not shown). A heatsink 60 is positioned with one surface 62 in thermal contact with the opposing low temperature surface (e.g., the surface 54) of the thermoelectric generator 50. Again, a thermally conductive adhesive (not shown) is preferably used to enhance the thermal contact between the thermoelectric generator 50 and the heatsink 60. Preferably, the heatsink 60 includes a plurality of fins 64 opposite the first surface 62. The fins 64 increase the surface area of the heatsink for dissipating the heat conducted to the heatsink through the thermoelectric generator 50.

An airflow generating device such as a fan 70 is positioned proximate to the fins 64 of the heatsink 60. In the embodiment of FIGS. 3 and 4, the fan 70 is a DC fan that operates with low voltage and current requirements. One exemplary fan is the "E" Series fan available from Operating Technical Electronics Inc., 850 Greenview Drive, Grand Prairie, Tex. 75050 [(214) 988-6828] which operates at 3.3 volts and 120 milliamperes and provides approximately 0.13 m³ of airflow per minute. This particular fan 70 has dimensions of 40 millimeters by 40 millimeters by 10 millimeters and is thus sufficiently small to be installed on the heatsink 60. The approximately 400 milliwatts of power required by the fan 70 is readily provided by the thermoelectric generator 50. Other suitable low-power airflow generating devices or other cooling devices may also be used. For example, a piezoelectric airflow generating device (not shown) may also be used.

Figure 5:
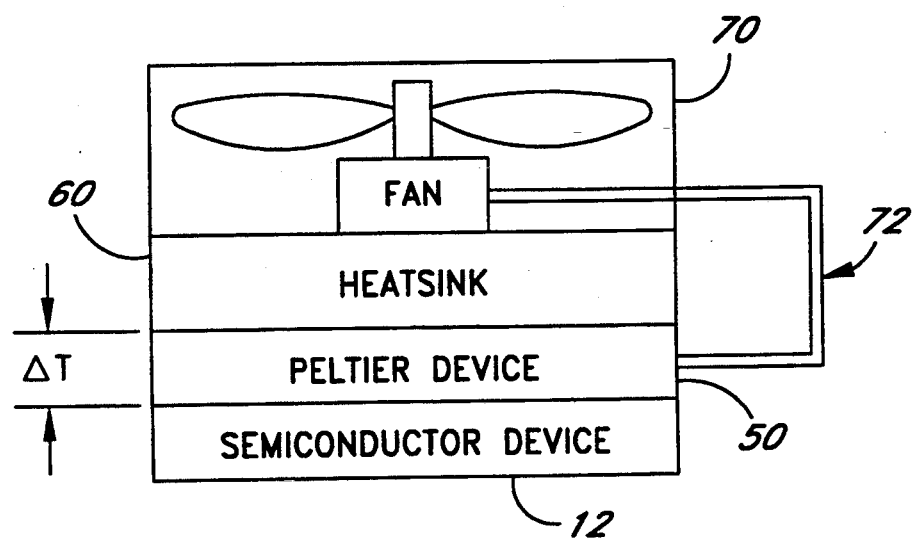
FIG. 5 illustrates an electrical schematic of the present invention showing the electrical connections between the thermoelectric generator and the fan attached to the heatsink.

As schematically illustrated in FIG. 5, the thermoelectric generator 50 is electrically connected to the fan 70 via a pair of wires 72 so that the voltage and current generated by the thermoelectric generator 50 is conducted to the fan 70. In operation, when the temperature of the integrated circuit 12 rises, a temperature differential $\Delta T$ develops across the thermoelectric generator 50 between the integrated circuit 12 and the heatsink 60. When the temperature differential $\Delta T$ reaches a sufficient magnitude (e.g., 50 degrees Centigrade), the voltage and current generated by the thermoelectric generator 50 is sufficient to cause the fan 70 to operate. The operation of the fan 70 causes airflow across the fins 64 of the heatsink 60 which reduces the temperature of the heatsink 60 thus causing more heat to be drawn away from the integrated circuit 12 to thereby reduce the temperature of the integrated circuit 12.

When the integrated circuit 12 generates more heat, such as, for example, when the integrated circuit 12 is a microprocessor that is performing intensive calculations, the temperature differential $\Delta T$ will increase to cause the voltage and current to increase and thereby increasing the power input to the fan 70. The increased power will increase the airflow caused by the fan 70 and thus increase the cooling effect of the fan 70 to compensate for the increased heat output of the integrated circuit 12. Thus, the present invention automatically compensates for increased heat output from the integrated circuit 12 to increase the airflow and move the excess heat away from the heatsink 60.

Figure 6:
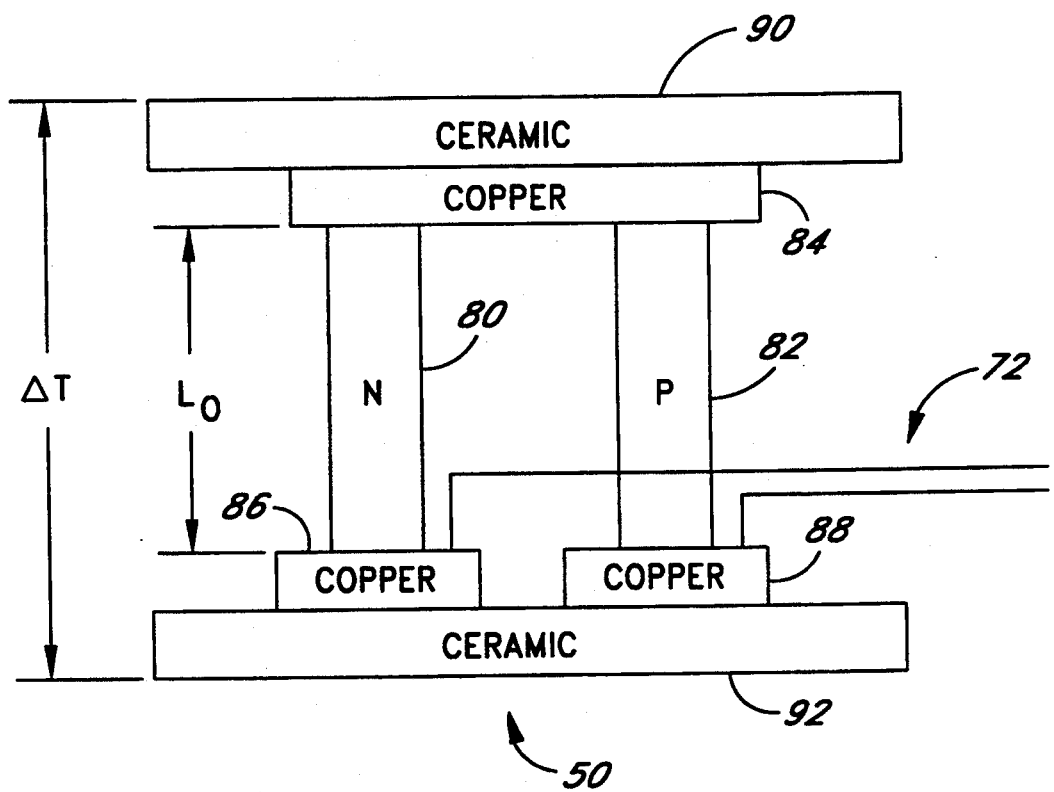
FIG. 6 illustrates a representation of an exemplary thermoelectric generator for use in the present invention.

FIG. 6 illustrates the exemplary thermoelectric generator 50 as explained by Gao Min and D. M. Rowe in the article cited above. Basically, the thermoelectric generator 50 comprises an N-type semiconductor thermoelement 80 and a P-type semiconductor thermoelement 82. The thermoelements 80, 82 are interconnected at respective first ends by an electrically conducting copper strip 84 and are connected to respective copper strips 86 and 88 at their respective second ends. The copper strips 86 and 88 are connected to the pair of wires 72 to provide the power output of the thermoelectric generator 50. The copper strip 84 is supported by a first plate 90 of highly thermally conductive but electrically insulating aluminum oxide (i.e., ceramic), and the two copper strips 86 and 88 are supported by a second plate 92 of the same material. The two thermoelements 80, 82 have lengths $L_0$ and a cross-sectional area of $A_0$ (not shown). As set forth by Gao Min and D. M. Rowe, the power generated by an ideal thermoelectric generator 50 can be expressed as:

$$P_i = \left(\frac{\alpha^2}{\rho}\right)\left(\frac{\Delta T^2}{2}\right)\left[\frac{A_0}{L_0}\right]$$

where $P_i$ is the power output of the thermoelectric generator 50, $\alpha$ is the Seebeck coefficient, $\rho$ is the bulk electrical resistivity of the thermoelements 80, 82, $\Delta T$ is the temperature difference across the thermoelements 80, 82, and $A_0/L_0$ is the ratio of the cross-sectional area to the length of the thermoelements 80, 82. Although the ratio $A_0/L_0$ implies that the power output $P_i$ increases without bound as the length of the thermoelements 80, 82 approaches 0, the conversion efficiency of the thermoelectric generator 50 decreases with decreasing length. Thus, as the length of the thermoelements 80, 82 decreases, the power output will reach a maximum at a particular ratio and will then decrease with further decreases in the length of the thermoelements 80, 82. As set forth above, the CP 1.4-127-045L thermoelectric module from MELCOR, U.S.A. is suitable as the thermoelectric generator 50 in present invention. In particularly preferred embodiments of the present invention, the length of the thermoelements 80, 82 will be reduced further to, for example, 0.5 millimeters, to increase the power output of the thermoelectric generator 50. The reduced length will cause a small decrease in the conversion efficiency; however, the reduced length will also increase the heat flow from the integrated circuit 12 to the heatsink 62. Other thermoelectric generators having a suitable geometry and power output can also be used to generate electrical power from the heat generated by the integrated circuit 12. If additional voltage is required for a particular fan, two or more thermoelectric generators can be connected electrically in series to increase the voltage output. In preferred embodiments, a thermoelectric module will be constructed having sufficient thermoelements to provide the required voltage output. Alternatively, a DC-to-DC convertor (not shown) or other suitable device can be included to convert the output voltage generated by the thermoelectric generator 50 to a voltage compatible with the fan 70 or other airflow generating device.

In particularly preferred embodiments of the present invention, the fan 70 (or other airflow generating device) can be designed to have an input impedance that closely matches the output impedance of the thermoelectric generator 50 to optimize the transfer of power from the thermoelectric generator 50 to the fan 70.

It should be appreciated that the electrical energy generated by the thermoelectric generator may also be advantageously used for other purposes in addition to the cooling effect described above. For example, the electrical energy may be used to charge a backup battery for a clock/timer, or the like, or to drive a low-power display.

Although described above in connection with particular embodiments of the present invention, it should be understood the descriptions of the embodiments are illustrative of the invention and are not intended to be limiting. Various modifications and applications may occur to those skilled in the art without departing from the true spirit and scope of the invention as defined in the appended claims.

What is claimed is:

1. An apparatus that removes heat from a semiconductor device, comprising:
   a thermoelectric generator that converts heat energy to electrical energy, said thermoelectric generator positioned on said semiconductor device to receive heat generated by said semiconductor device, said thermoelectric generator producing an output voltage in response to said heat; and
   an airflow generating device electrically connected to receive said output voltage from said thermoelectric generator and responsive to said output voltage to cause air to flow, said airflow generating device positioned proximate to said semiconductor device so that air caused to flow by said airflow generating device removes heat from said semiconductor device to thereby reduce the temperature of said semiconductor device.

2. The apparatus as defined in claim 1, wherein said airflow generating device is a fan.

3. The apparatus as defined in claim 1, further including a heatsink that increases the rate at which heat is conducted away from said semiconductor device, said thermoelectric generator positioned between said heatsink and said semiconductor device, said airflow generating device positioned to cause air to flow over said heatsink.

4. The apparatus as defined in claim 1, wherein said thermoelectric generator comprises a Peltier cooler operating in the Seebeck mode wherein the power generated by the thermoelectric generator is responsive to the temperature difference across the thermoelectric generator.

5. A method for cooling a semiconductor device comprising the steps of:
   positioning a thermoelectric generator proximate to the semiconductor device;
   generating electrical power by said thermoelectric generator in response to heat generated by said semiconductor device;
   connecting said electrical power generated by said thermoelectric generator to an airflow generating device; and
   generating an airflow to remove heat from said semiconductor device in response to said electrical power generated by said thermoelectric generator.

6. The method as defined in claim 5, wherein said airflow generating device comprises a fan.

7. The method as defined in claim 5, wherein said thermoelectric generator comprises a Peltier cooler operating in the Seebeck mode to generate electrical power from a temperature differential across the thermoelectric generator.

8. The method as defined in claim 5, further including the step of positioning the thermoelectric generator between said semiconductor device and a heatsink.

9. A method for utilizing the heat energy generated by a semiconductor circuit in an electronic system, comprising the steps of:
   positioning a thermoelectric generator proximate to the semiconductor circuit so that the heat generated by the semiconductor circuit is transferred to said thermoelectric generator;
   generating electrical energy by said thermoelectric generator responsive to said heat transferred from said semiconductor circuit;
   transferring said electrical energy to an electrically operated device; and
   operating said electrically operated device in response to said electrical energy.

10. The method as defined in claim 9, wherein said electrically operated device comprises a cooling device that reduces the temperature of said semiconductor circuit.

11. The method as defined in claim 10, wherein said cooling device comprises a airflow generating device.

12. The method as defined in claim 11, wherein said airflow generating device comprises a fan.

13. The method as defined in claim 9, wherein said thermoelectric generator comprises a Peltier module operating in the Seebeck mode.

14. The method as defined in claim 9, further comprising the step of positioning a heatsink proximate to said thermoelectric generator so that heat transferred from said semiconductor circuit to said thermoelectric generator is further transferred through said thermoelectric generator to said heatsink, said heatsink thereby increasing the flow of heat to said thermoelectric generator from said semiconductor circuit.

15. The method as defined in claim 14, wherein said electrically operated device comprises a fan positioned proximate to said heatsink, and wherein said step of further comprising a electrically powered airflow generating device, said airflow generating device operating in response to said electrical energy transferred from said thermoelectric generator to cause air to flow proximate to said heatsink, said air dissipating heat transferred to said heatsink.

* * * * *